United States Patent [19]

Takayama

[11] 4,260,224

[45] Apr. 7, 1981

[54] MULTI-LAYER LIQUID CRYSTAL PANEL

[75] Inventor: Masaji Takayama, Suwa, Japan

[73] Assignee: Kabushiki Kaisha Suwa Seikosha, Tokyo, Japan

[21] Appl. No.: 930,438

[22] Filed: Aug. 2, 1978

[30] Foreign Application Priority Data

Aug. 2, 1977 [JP] Japan .................................. 52-92776

[51] Int. Cl.³ .............................................. G02F 1/133
[52] U.S. Cl. ...................................... 350/335; 350/334
[58] Field of Search ......................... 350/335, 334, 336

[56] References Cited

U.S. PATENT DOCUMENTS

| 3,588,225 | 6/1971 | Nicastro | 350/335 |
| 3,661,444 | 5/1972 | Matthies | 350/335 |
| 3,853,391 | 12/1974 | Sorkin | 350/341 |
| 3,903,519 | 9/1975 | Zega | 350/335 X |

*Primary Examiner*—Edward S. Bauer
*Attorney, Agent, or Firm*—Blum, Kaplan, Friedman, Silberman & Beran

[57] ABSTRACT

In a multi-layer liquid crystal display panel the terminals for making connection to the electrodes on the plates of each cell layer are so disposed that the terminals for each cell are out of registry with the terminals for all of the other cells. The terminals are connected to external circuitry by way of conductive elastomer blocks, the compressibility of the blocks being such that substantially identical blocks can be used for making contact with the terminals on all of the plates.

7 Claims, 22 Drawing Figures

MULTI-LAYER LIQUID CRYSTAL PANEL

BACKGROUND OF THE INVENTION

In the design and manufacture of multi-layer liquid crystal display panels, it has been necessary to provide for making electrical connection with the electrodes on each of the plates of each of the layers in the multi-layer display device. In general, connection to the electrodes has been effected through terminals disposed at the edge of each plate. In order to gain access to each terminal, it has been necessary to make each plate in the multi-layer stack larger than the plate below same. This has had the unfortunate and undesired consequence that the lowest plate in a stack is substantially smaller than the highest plate so that the available area for display by the entire stack is limited to that of the lowest plate in the stack, which, as aforenoted, is considerably smaller than the highest plate. As is evident, it would be highly desirable that the difference in size between the lowest and highest plates be minimized. The present invention is designed to achieve this objective.

SUMMARY OF THE INVENTION

In multi-layer liquid cyrstal panel, each plate comprising the panel has at least one electrode and an electrode terminal thereon, the electrode and the electrode terminal being electrically continuous. The multi-layer panel is made up of a plurality of pairs of plates, each pair of plates constituting a cell. One edge of each upper plate extends below the lower plate of the pair as well as beyond the corresponding edges of the plates of the pairs below same. The electrode terminal for each upper plate is disposed on that portion of the edge which extends beyond the edges of the plates below same. The extended portion of each of the upper plates lies along a different corresponding edge of the panel. Accordingly, none of the electrode terminals are in registry with each other. Also, since only one edge of any plate need extend beyond the corresponding edges of the plates below same, the difference in size between any plate and the plates below same is minimal.

Electrical connection between the electrode terminals and external circuitry is made by way of conductive elastomeric means, a preferred elastomer being rubber. The compressibility of the rubber relative to the thickness of the panel and the plates of the panel is selected to be such that blocks of conductive elastomer of substantially identical height can be used throughout.

Accordingly, an object of the present invention is a multi-layer liquid crystal panel of maximum display area.

Another object of the present invention is a multi-layer liquid crystal panel wherein electrode terminals are disposed along the edges of the upper plate in each of the cells comprising said panel and said terminals are so disposed that no terminals are in registry with each other.

A further object of the present invention is a multi-layer liquid crystal panel in which the upper plate in each pair of plates making up a cell extends at only one edge thereof over the other of the plates in said cell and over the plates of the cells below same in said panel.

An important object of the present invention is a multi-layer liquid crystal panel in which electrical contact between electrode terminals and external circuitry is made by means of a conductive elastomer and in which the heights of the blocks of elastomer used for making said contact are substantially identical.

Still other objects and advantages of the invention will in part be obvious and will in part be apparent from the specification.

The invention accordingly comprises an article of manufacture possessing the features, properties, and the relation of elements which will be exemplified in the article hereinafter described, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
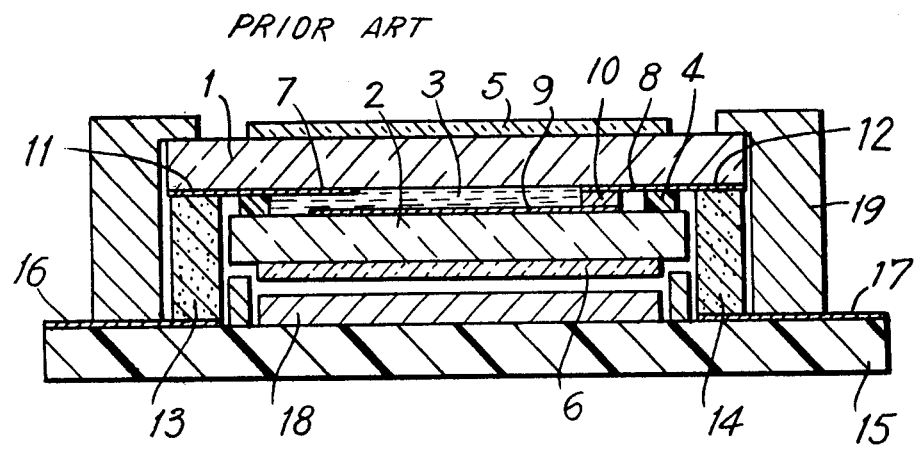
FIG. 1 is a sectional view of a conventional single-layer liquid crystal panel in a display device.

In the conventional single-layer liquid crystal panel shown in FIG. 1, upper panel glass 1 and lower panel glass 2 function as electrode substrates and are both of transparent glass. Liquid crystal material 3 is held in a thin layer between upper and lower panel glasses 1 and 2 and the cell is sealed by seal member 4. Polarizing plates 5 and 6 sandwich the cell. A transparent segment electrode 7 and a lead electrode 8 for a common electrode are provided on upper panel glass 1. Transparent common electrode 9 is disposed on lower panel glass 2 and electrically connected with lead electrode 8 through conducting member 10 which may be of a conducting rubber or other conductive elastomer. Segment electrode 7 and lead electrode 8 have electrode terminal portions 11 and 12 at opposite ends of panel glass 1, these terminal portions being electrically connected with patterned-copper leaves 16 and 17 on circuit board 15, connection being made through conductive resilient members 13 and 14. A reflecting plate 18 makes it easier to read the figures displayed on the liquid crystal panel. The panel is held in panel frame 19 relative to circuit board 15. An external driving circuit is connected with the panel through the copper-leaf pattern 16 and 17. The signal from the external circuitry passes through conductive resilient members 13 and 14 and produces a voltage between segment electrode 7 on upper panel glass 1 and common electrode 9 on lower panel glass 2.

Figure 2:
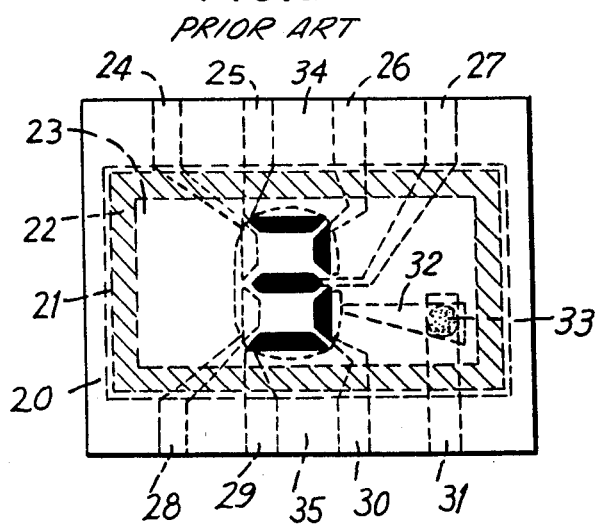
FIG. 2 is a plan view of the embodiment of FIG. 1.

A plan view of the liquid crystal panel of FIG. 1 is shown in FIG. 2. In the view of FIG. 2, the panel comprises an upper panel glass 20, a lower panel glass 21 and a seal member 22 enclosing liquid crystal material 23. Segment electrodes 24 through 30 are provided on upper panel glass 20. A transparent lead electrode 31 is provided on upper panel glass 20 for making connection to transparent common electrode 32 on lower panel glass 21. Portions 34 and 35 are provided on upper panel glass 20 as electrode terminals for segment electrodes 24 through 30 and lead electrodes 31. As shown in FIG. 2, the figure "3" is displayed by applying voltage between common electrode 32 and the segment electrodes 25, 26, 27, 29 and 30.

Figure 3:
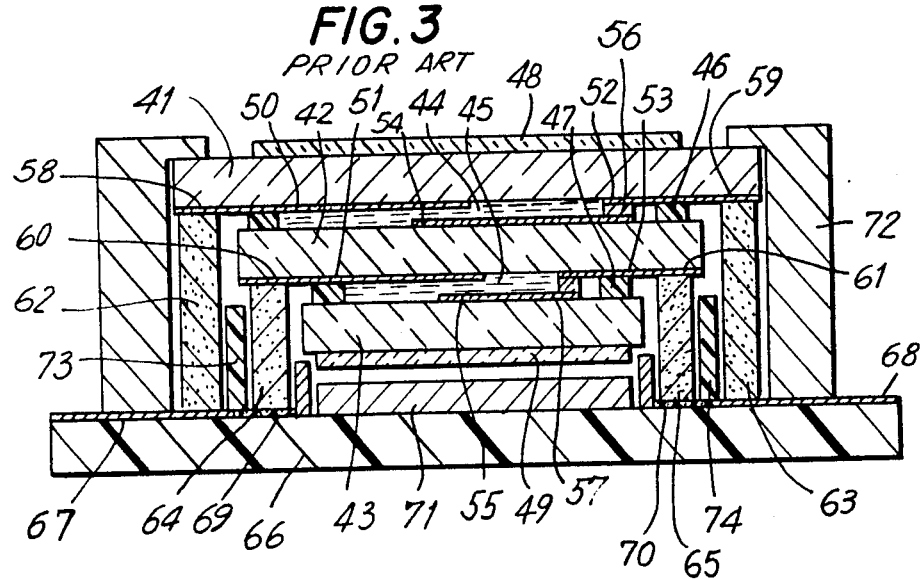
FIG. 3 is a sectional view of a conventional bi-layer liquid crystal panel.
Figure 4:
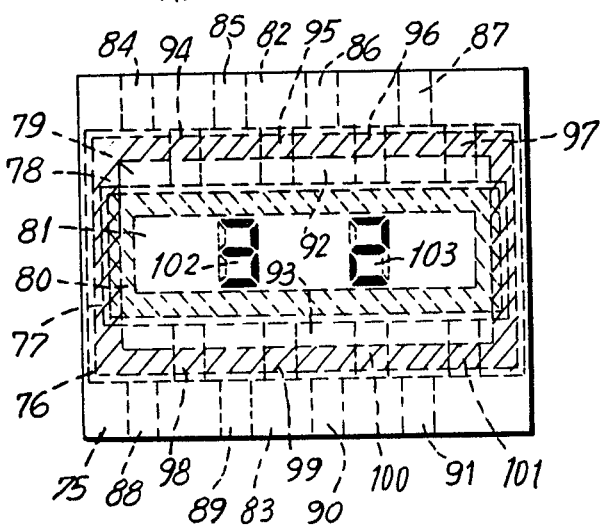
FIG. 4 is a plan view of the embodiment of FIG. 3.

A conventional double-layer liquid crystal panel is shown in sectional view in FIG. 3 wherein the double layer includes upper panel glass 41, middle panel glass 42 and lower panel glass 43. Liquid crystal layers 44 and 45 are respectively packaged between upper panel glass 41 and middle panel glass 42 and between middle panel glass 42 and lower panel glass 43, the layers being sealed by seal members 46 and 47. Polarizing plates 48 and 49 are attached respectively to upper and lower panel glasses 41 and 43. Transparent segment electrodes 50 and 51 and transparent lead electrodes 52 and 53 for the common electrodes are located on the inner surfaces of the upper glass plate of each layer. Transparent common electrodes 54 and 55 are disposed on the inner surfaces of the lower plate of each layer and are electrically connected with the lead electrodes 52 and 53 through conductive members 56 and 57. The lead electrodes 52 and 53 for the common electrodes, and the segment electrodes 50 and 51 each have end portions 58, 59, 60 and 61 which serve as electrode terminals or contacts for making connection with copper-leaf patterns 67, 68, 69 and 70 on circuit board 66, connection being made through conductive resilient members 62, 63, 64 and 65. A reflector plate 71 is provided for enhancing the visibility of the display. Panel frame 72 fixes the liquid crystal panel to the circuit board 66. Insulating plates 73 and 74 prevent contact between conductive members 62 and 64 and between conductive members 63 and 65. Copper-leaf patterns 67, 68, 69 and 70 are connected to an external liquid crystal driving circuit and the signal from the circuit passes through the conductive resilient members 62–65 to generate a voltage between segment electrodes 50 and 51 and common electrodes 54 and 55 for showing a desired digital display. The panel glasses and arrangement of the electrodes are shown in a conventional double-layer liquid crystal display in FIG. 4 in which the upper layer comprises upper panel glass 75, middle panel glass 76 with seal member 78 therebetween and the lower layer comprises middle glass 76 and lower panel glass 77 with liquid crystal 79 therebetween. The upper is sealed by seal member 78 and the lower layer is sealed by seal member 80, liquid crystal 81 being disposed in the lower layer. Electrode terminals 82 and 83 are disposed on upper panel glass 75 for making connection with terminals 84 through 91 of the segment electrodes and the lead electrodes for the common electrodes. Portions 92 and 93 are provided on the lower surface of the middle panel glass for making contact with the electrodes thereon, the segment electrodes having terminals 94 through 101. The arrangement of the electrodes with respect to the liquid crystal material is the same as that in FIG. 2 in each of the liquid crystal layers. The array of seven segments for producing the left-hand digit in FIG. 4 is indicated by the reference numeral 102, the figure "3" being displayed by the upper layer. Similarly, the seven-segment array indicated by the reference numeral 103 is located in the lower layer and is shown as being activated to display the figure "2". It should be noted that since seal members 78 and 80 are opaque, it is necessary for the arrays 102 and 103 to be disposed within seal member 80 of the lower layer. As will be evident, this requirement severely restricts the fraction of the liquid crystal panel which is available for actual display.

Comparing the conventional double-layer liquid crystal panel with the conventional single-layer liquid crystal panel, has the distinct advantages that the display of the upper layer can be superimposed on that of the lower layer and that the available material which can be displayed by the two layers is twice that which can be displayed by a single layer device. However, if the external dimensions of the double-layer liquid crystal panel are the same as those of a single-layer liquid crystal, with respect to the plane of the display, the area available for actual display of digits is decreased by the size of the area of portions 92 and 93 necessary for providing terminals to the electrodes on the middle panel glass 77. Consequently, where a double-layer liquid crystal panel is to be utilized in a product which is restricted in size as in a wristwatch, a severe restriction is imposed on the size of the figures which may be displayed, or, conversely, the number of figures which can be displayed is reduced, since the actual area available for display is decreased. A further disadvantage of the conventional double-layer liquid crystal panel construction is that as many as four conductive resilient members 62, 63, 64 and 65 are needed as shown in FIG. 3, and, moreover, insulating plates 73 and 74 must be provided to prevent accidental electrical contact between the resilient members. These requirements increase the number of parts which raises the cost of the final product as well as the size thereof. In addition, the number of process steps in the assembly of the device is increased so that the cost is likewise increased by this factor.

These difficulties are eliminated by the constructions of the present invention. An embodiment of the invention is shown in section in FIG. 5 which illustrates a double-layer liquid crystal display device. The embodiment of FIG. 5 includes upper panel glass 111, middle panel glass 112 and lower panel glass 113, all of the panel glasses being transparent and serving as electrode substrates. Liquid crystal material 114 and 115 is packaged between upper panel glass and middle glass 112 and between middle panel glass 112 and lower panel glass 113 respectively, the layers being sealed by seal members 116 and 117. Polarizing plates 118 and 119 are disposed above upper panel glass 111 and below lower panel glass 113 respectively. Transparent lead electrodes 122 and 123 are provided for transparent common electrodes 124 and 125 electrical connection between the lead electrodes and the transparent common electrodes being made by way of connecting members 126 and 127. Portion 128 is provided on the inner surface of upper panel glass 111 for making connection to the transparent electrodes and terminals of segment electrode 120 and of lead electrode 122 for the common electrode are provided in this portion. A portion 129 is provided on middle panel glass 112 for making connections to the terminals of the segment electrodes 121 and lead electrodes 123, portion 128 being at the opposite end of the panel from portion 128. Further, all of the terminals for making connection with the electrodes in a single layer of the panel are at one edge of the panel and different edges of the panel are used for the terminals of different layers. This is the preferred arrangement since disposing all of the electrode terminals for a given layer at a single edge of the panel makes it easy to insure that the electrode terminals for any given layer will be out of registry with those of any other layer.

The terminals of all of the electrodes are connected with copper-leaf patterns 133 and 134 on circuit board 132 through conductive resilient members 130 and 131. Reflector panel 135 increases the visibility of the figures displayed by the liquid crystal panel. The panel is held to circuit board 132 by panel frame 136. The copper-leaf patterns 133 and 134 are connectable to external circuitry for driving the liquid crystal displays. The signal from the external circuitry traverses conductive resilient members 130 and 131 for generating the required selected voltages between segment electrodes 120 and 121 and the common electrodes 124 and 125.

Figure 6:
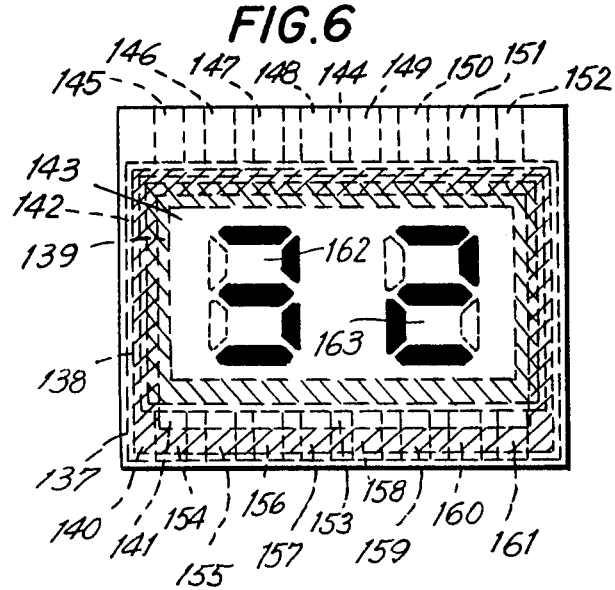
FIG. 6 is a plan view of the embodiment of FIG. 5.

FIG. 6 is a plan view of a double-layer liquid crystal panel in accordance with the present invention the double layers including upper panel glass 137, middle panel glass 138 and lower panel glass 139. Seal member 140 is disposed between upper panel glass 137 and middle panel glass 138 and seal member 142 lies between middle panel glass 138 and lower panel glass 139. Liquid crystal material 141 is packaged within seal member 140 and liquid crystal 143 within seal member 142. Portion 144 is provided on upper panel glass 137 for making connection to the electrodes thereon. The segment electrodes have contact terminals 145 through 152 and the lead electrodes for the common electrodes for driving liquid crystal 141 are disposed in portion 144. Portion 153 which is on the edge of the display panel opposed to portion 144 is provided for making contact with the electrodes on middle panel glass 138. Terminals 154 through 161 for making connection with the segment electrodes and the lead electrodes for the common electrodes are all disposed in portion 153. The electrode arrangement in the liquid crystals 141 and 143 is the same as in FIG. 2. The figure displayed by the liquid crystal 141 is indicated by the reference numeral 162 and in this case is a numeral "3". The figure displayed by liquid crystal 143 is indicated by the reference numeral 163 and, in this case, is the numeral "2".

As aforenoted, in the double-layer liquid crystal panel in accordance with the present invention, the portions of the glass plate provided for disposing the electrode terminals thereon is at a single region of the plate so that the portions of the plates of different liquid crystal layers on which electrode terminals are disposed may not overlap each other, that is, must be out of registry with each other. With this type of structure, the area in which figures are to be displayed can be almost as great as that of a single-layer liquid crystal panel having the same external planar dimensions. A further advantage in a double-layer liquid crystal panel in accordance with the present invention is that the overall structure is essentially the same as that of a single-layer liquid crystal panel so that only two conductive resilient members are needed making the presence of the insulating plates 64 and 65 of FIG. 3 unnecessary. In addition, the assembly of embodiments in accordance with the present invention is extremely easy.

Figure 7:
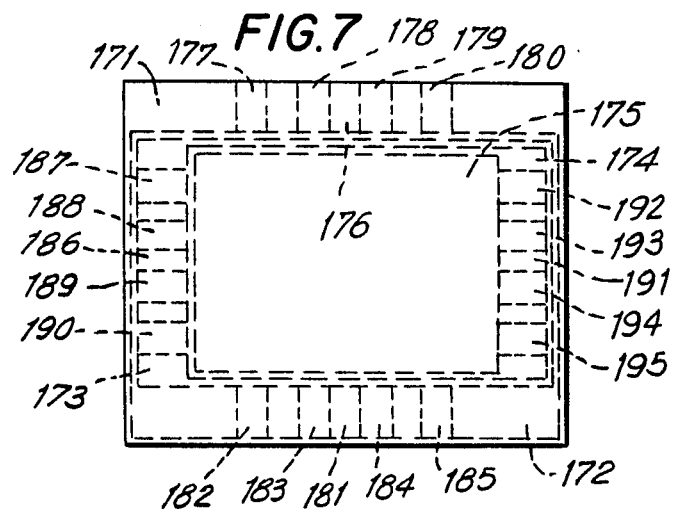
FIG. 7 is a plan view of a portion of a fourfold-layer liquid crystal panel showing an arrangement of the plates in said panel and the electrode terminals on said plates.

The structure taught herein can be applied to panels having a larger number of layers than two. FIG. 7 is a plan view of the electrode and terminal arrangement of an embodiment of a fourfold-layer liquid crystal panel in which five transparent electrode substrates, 172 through 175 are shown, all of the substrates being of glass. Electrode substrate 171, for instance, has a portion 176 on which are disposed all of the electrode terminals for this substrate, it being noted that all of the terminals of this substrate lie along edge portion 176. Thus, portion 176 serves for segment electrode terminals 177, 178, 179 and 180 as well as the lead electrodes for the common electrodes on the upper surface of the adjacent plate. Similarly, electrode substrate 172 has a portion 181 along the bottom edge thereof, as viewed in FIG. 7, along which are disposed terminals 182, 183, 184 and 185 for the segment electrodes and the lead electrodes for the common electrodes. Again, the left-hand edge 186 serves for holding the terminals 187, 188, 189 and 190 of the segment electrodes on electrode substrate 173 as well as for the lead electrode for the common electrodes. Finally, substrate 174 has edge portion 191 on which are disposed terminals 192, 193, 194 and 195 connected with the segment electrodes and the lead electrodes for the common electrodes. As is evident, this quadruple-layer liquid crystal panel has a display portion which is almost as large as that of a single-layer liquid crystal panel.

Figure 8:
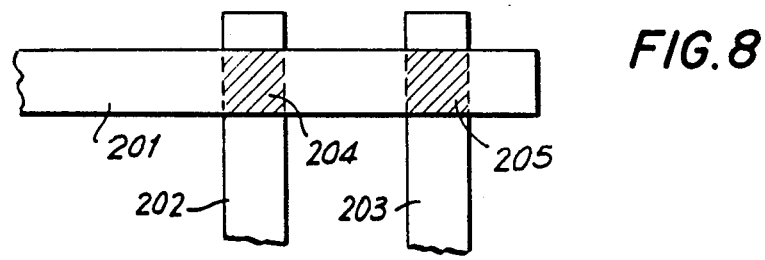
FIG. 8 shows the disposition of electrodes for $\frac{1}{2}$ multiplex drive.
Figure 9A:
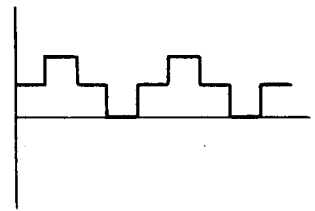
FIGS. 9a and 9b show wave forms of inputs which are applied to common electrodes for $\frac{1}{2}$ multiplex drive.
Figure 9B:
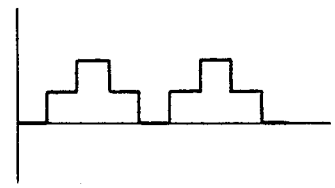
Figure 10C:
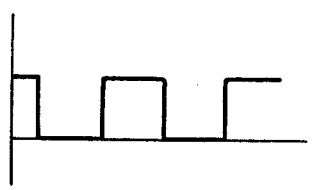
FIGS. 10c, 10f, 10i and 10l show input wave forms which may be applied to segment electrodes.
Figure 10D:
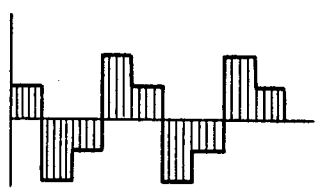
FIGS. 10d, 10e, 10g, 10h, 10j, 10k, 10m and 10n show wave forms of potential difference resulting from the inputs shown in the previous Figures.
Figure 10E:
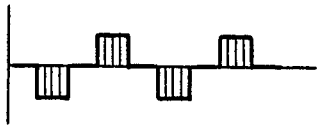
Figure 10F:
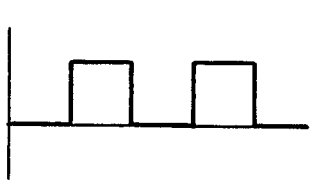
Figure 10G:
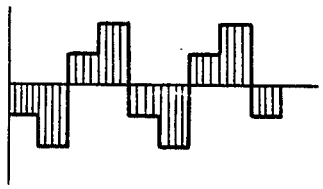
Figure 10H:
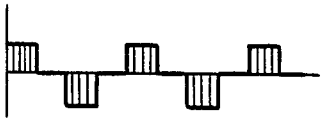
Figure 10I:
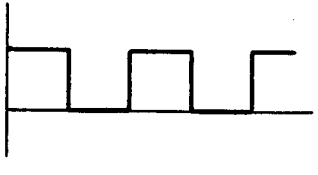
Figure 10J:
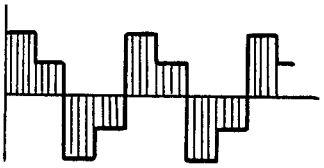
Figure 10K:
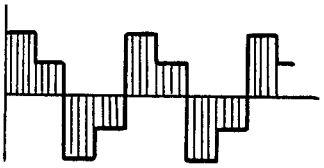
Figure 10L:
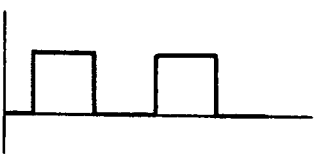
Figure 10M:
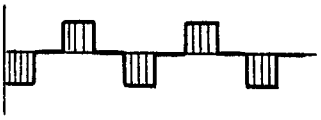
Figure 10N:
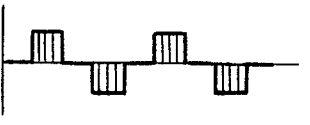

FIGS. 9a and 9b represent waveforms of inputs which are applied to the common electrodes 202 and 203 of FIG. 8 for ½ multiplex drive. The waveform of FIG. 9a represents the input voltage applied to the common electrode 202 and FIG. 9b represents the input voltage applied to the common electrode 203.

Four kinds of input waveforms which may be applied to segment electrodes are shown in FIGS. 10c, 10f, 10i and 10l. These waveforms have phase-shifted voltages and constitute the input to segment electrode 201. FIGS. 10d, 10g, 10j and 10m show the difference between the input voltages 10c, 10f, 10i and 10l into the segment electrode 201 and the input voltages 9a into the common electrode 202, in other words, the voltage which is applied to the overlap portion 204. Since the voltage characteristic of excitation of liquid crystal is non-linear, the liquid crystal material is excited at the effective voltage where the waveform of the potential difference is 10d, 10e, 10g and 10k and the liquid crystal is not excited when the effective voltage is such that the potential difference is 10h, 10j, 10m or 10n. From the above discussion, it can be seen that two segments can independently turn on or off by the use of only one segment electrode. Where this ½ multiplex drive method is applied to the double-layer liquid crystal panel which is one of the embodiments of the present invention, it is possible to provide the same content of display on one side of the liquid crystal of the double-layer liquid crystal panel without making small the separation between electrode terminals if the electrode terminals provided in two adjacent portions for leading the electrodes of the conventional single-layer liquid crystal panel are joined in one portion for making connection to the electrodes. Consequently, since the separation between terminals can be made larger, the electrode structure of the liquid crystal panel is simple, especially since if the separation between terminals is substantial, then assembly tolerances can be relatively large which makes assembling extremely easy. Moreover, use of multiplex drive methods such as ⅓, ¼ and so forth, brings additional advantages as aforenoted.

Figure 5:
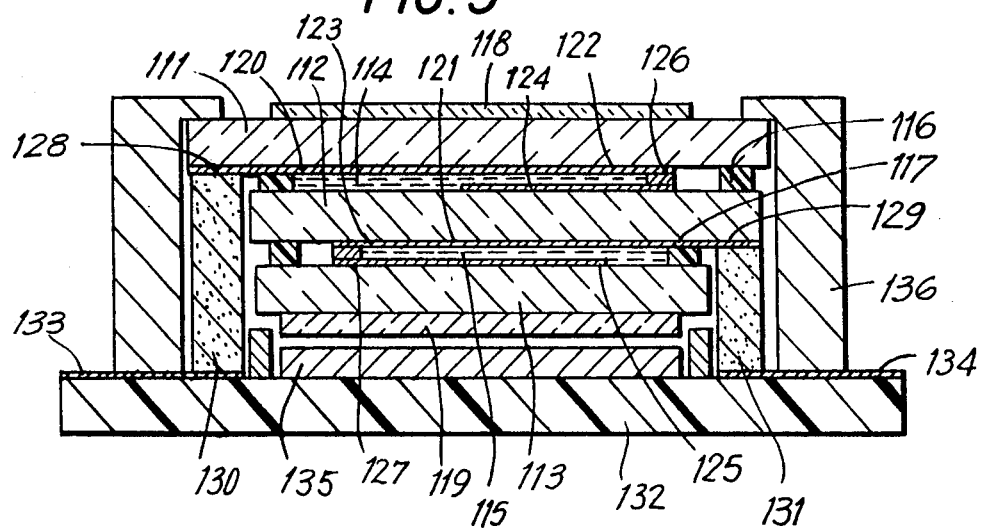
FIG. 5 is a sectional view of a double-layer liquid crystal panel in accordance with the present invention.

A further advantage of the present structure can be seen in reference to FIG. 5, for example, in which electrical connection can be provided by substituting conductive resilient member 130 for conductive resilient member 131 under the condition that the thickness of the middle panel glass 112 is smaller than the compressibility of the conductive resilient member 131. As a result, only one type of elastomeric member need be provided, thus resulting in a further reduction in cost. Moreover, the thickness of the display device itself becomes smaller. These advantages accrue whenever the multi-layer liquid crystal panel has more than two liquid crystal layers. The same advantages can be obtained by placing one single-layer liquid crystal panel over another to constitute a multi-layer panel. The present invention is applicable to a liquid crystal watch, a wristwatch, an electric calculator having a liquid crystal display and any other display devices which use liquid crystal display panels.

It will thus be seen that the objects set forth above, among those made apparent from the preceding description, are efficiently attained and, since certain changes may be made in the above article without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A multi-layer liquid crystal display device comprising at least two liquid crystal display cells having four edges, said cells aligned along a line of sight, each display cell including a pair of opposed transparent glass plates with a liquid crystal material sealed therebetween, one of said plates of each cell having transparent electrode means disposed thereon for forming a common electrode, the other of said plates having a plurality of segmented transparent electrode means disposed thereon for forming at least one complete character when an electric field is selectively applied across said liquid crystal between said segment electrode means and said common electrode means, one of said plates having a terminal region on a single edge in each cell, said terminal region extending beyond the edge of the opposed plate, all of the terminals for connecting the electrodes of each display cell to the electrical circuitry through conducting resilient means being located on said terminal region, said terminal region for each cell extending beyond the corrresponding edges of the remaining cells behind said terminal region.

2. The multi-layer liquid crystal display device of claim 1, wherein the segmented electrode means for forming characters is disposed on the inner surface of the upper plate and the electrode means for forming the common electrode is disposed on the inner surface of the lower plate in each of the cells.

3. The multi-layer liquid crystal display device of claim 2, wherein said plates are rectangular.

4. The multi-layer liquid crystal display device of claim 3, wherein said segmented electrode means is a seven bar array for forming at least one complete alphanumeric character on each cell.

5. The multi-layer liquid crystal display device of claim 1, further including conductive resilient means for electrically connecting said terminals at the terminal region with external circuitry for selectively applying the electric field to the cell.

6. The multi-layer liquid crystal display device of claim 5 including between two and four layers.

7. The multi-layer liquid crystal display device of claim 9 having two display cells, said terminal region for one display cell being on the opposite side of the display device from the terminal region for the second display cell, and further including conductive resilient means for electrically connecting said withdrawn electrodes at the terminal regions with external circuitry for selectively applying the electric field to the cells.

* * * * *